United States Patent [19]

Morreale

[11] 4,220,845
[45] Sep. 2, 1980

[54] FLAT CABLE SOLDERING APPARATUS

[75] Inventor: Charles Morreale, Fort Lauderdale, Fla.

[73] Assignee: Burroughs Corporation, Detroit, Mich.

[21] Appl. No.: 947,901

[22] Filed: Oct. 2, 1978

[51] Int. Cl.² .............................................. H05B 1/00
[52] U.S. Cl. ................................ 219/243; 219/85 D; 228/180 A
[58] Field of Search .................... 219/243, 85 R, 85 D; 156/583.2, 583.7, 583.8, 583.9; 228/179, 180 A, 180 R, 51; 101/27

[56] References Cited

U.S. PATENT DOCUMENTS

| | | | |
|---|---|---|---|
| 3,428,512 | 2/1969 | Cooper | 156/583.9 X |
| 3,475,814 | 11/1969 | Santangini | 228/180 A X |
| 3,896,285 | 7/1975 | Delorme | 219/85 X |
| 3,943,323 | 3/1976 | Smith et al. | 219/85 |
| 3,991,297 | 11/1976 | Ammann | 219/243 |
| 4,058,055 | 11/1977 | Douglas | 101/27 X |
| 4,081,658 | 3/1978 | Ammann | 219/243 X |
| 4,117,306 | 9/1978 | Shah | 219/243 |

FOREIGN PATENT DOCUMENTS 2139498  2/1973  Fed. Rep. of Germany ........ 219/85 D Primary Examiner—C. L. Albritton
Attorney, Agent, or Firm—David G. Rasmussen; Kevin R. Peterson

[57] ABSTRACT

Apparatus for soldering a plurality of conductors simultaneously to a printed circuit board or suitable connector card and having a controlled pressure-temperature cycle. The apparatus comprises a heater bar mounted on one end of a frame which is vertically pivotable about a support bracket. The support bracket is mounted to a generally flat, rectangular base for receiving a cable to be soldered. The heater bar is formed from metallic bar stock having a rounded contacting end. Two channels are formed along the length of the heater bar: a heating channel holds a resistance heating element, and a cooling channel is connected at one end to a supply of compressed air. The vertical motion and contact pressure of the pivoting frame-heater bar assembly is controlled by a timer which vents compressed air to an air cylinder connected to the frame. The timer also controls the supply of compressed air to the cooling channel of the heater bar, and cycles the resistance heating element on and off in response to a thermostat mounted on top of the heater bar.

10 Claims, 3 Drawing Figures

FLAT CABLE SOLDERING APPARATUS

BACKGROUND OF THE INVENTION

The invention relates to the field of soldering apparatus and more particularly to apparatus for simultaneously soldering a flat plural conductor cable to a printed circuit board or connector and having a controlled pressure-temperature cycle.

Flat multi-conductor cables are used extensively in electrical communications and data processing devices. Typically, such a cable comprises a multiplicity of parallely-spaced conductive leads (upwards from two conductors to a quantity limited by the state of the art) arranged on equally spaced centers in a flat cable or ribbon configuration. Generally, such leads are stripped and pretinned before a soldering operation is commenced. Due to the closeness of the leads and the large number of soldered connections to be made when joining a flat cable to a printed circuit (PC) card or suitable socket connector, the prior art has developed several methods of simultaneously bonding these conductors to such PC boards or connectors. It has been recognized that in order to achieve uniformly soldered electrical connections between the cable conductors and PC card that uniform heating of the solder joints is useful. U.S. Pat. Nos. 4,081,658 and 3,991,297 show electrically heated soldering devices wherein a pair of massive electrically and thermally conductive members are bridged by "U" or "V" shaped heating elements. A source of electrical current is connected to each conductive member to cause the heating element to rise in temperature. The heating element is then pressed against a joint to be soldered. When electric current is removed from the heating element, the conductive members act as heat sinks to cool the heating element.

An alternative configuration has been proposed in U.S. Pat. No. 3,943,323 wherein a bonding head is formed of a material having relatively low thermal conductivity but high mechanical strength, such as carbon steel. A channel is formed within the head into which a resistance heating element is inserted. The remaining space of the heater channel is filled with a material having high thermal conductivity but low mechanical strength, such as copper or aluminum.

While such devices have attempted to provide for fairly uniform heating characteristics of the soldering head, it also has been recognized that a uniform pressure along such a soldering head against the conductors and PC card to be soldered is vital to insure reliable electrical contacts. U.S. Pat. No. 3,896,285 discloses flat cable soldering apparatus comprising a base having a heating bar disposed therein with its face flush with the surface of the base. An elongated pressure bar is suspended over the heater bar and is controlled by the operator of the machine. A circuit card and cable to be soldered are inserted face down into slideways built into the base such that the area to be soldered is placed directly over the heater bar. The pressure bar is then lowered by the operator for a predetermined time to complete the bond.

While the prior art shows several types of plural conductor soldering apparatus, none of these apparatus allows for a controlled temperature-pressure cycle. A controlled temperature-pressure cycle allows repeatable, uniform soldered electrical connections to be made between flat-cable conductors and PC cards or connectors. Prior art soldering apparatus have failed to provide for a controlled cool-down of the soldered contacts. Prior art devices have failed to provide for a simple and readily transportable soldering device which is adjustable for various size cables and PC cards or connectors.

SUMMARY OF THE INVENTION

These and other problems and disadvantages of prior art soldering devices are overcome in the present invention wherein there is provided a multi-wire soldering apparatus comprising a heating means mounted on one end of a frame member which is vertically pivotable about a support bracket. The support bracket is mounted to a flat base member which includes adjustable circuit card or connector receiving means.

The heating means comprises an elongated rectangular member formed of a thermally conductive material and having a rounded contacting end and at least two channels formed therein. One channel is adapted to receive a resistance heating element, while the other is connected to a supply of compressed air or other cooling fluid.

The vertical motion of the pivoting frame is controlled by a timing and control means which energizes a frame driving or pivoting means, such as an air cylinder. The timing and control means controllably supplies electrical current to the heating element and, responsive to a thermostat mounted on the heating means, energizes and cycles the frame driving means to cause the heating means to contact a cable and PC card or connector disposed within the receiving means for a predetermined period of time at a predetermined pressure. After a preset amount of soldering time has elapsed, the timing means cuts current flow to the resistance element and actuates a valve to the air supply to vent air into the cooling channel formed in the heating means so as to controllably dissipate the heat of the heating means and lower the soldered PC card or connector-to-cable joint below the eutectic point. When the heating means has cooled below a certain point as sensed by the thermostat, or a predetermined setting of the timer, the frame driving means is deenergized causing the heating means to be moved away from the soldered cable. The timing and control means is then reset for the next soldering operation.

The base member may further include a switch or interlock means which acts to prevent actuation or energization of the timing and control means unless a PC card or connector is properly oriented within the receiving means. The described soldering apparatus may also be operated manually by switches without the use of the timing and control means. Thus, the present invention provides for a simple, economical and compact multiwire soldering apparatus having controlled heating, pressure, and cool-down cycles. The effect of the novel combination herein described is to produce uniform solder joints simultaneously for various sizes and numbers of multiwire flat cables. Such a result is due to the controlled heating, pressure, and cooling cycle applied to the cable-to-PC card or connector joints by the apparatus of the present invention.

BRIEF DESCRIPTION OF THE DRAWINGS

These and other objects, features, and advantages of the present invention will be readily apparent from the following description of the preferred embodiment

DESCRIPTION OF THE PREFERRED EMBODIMENT

Figure 1:
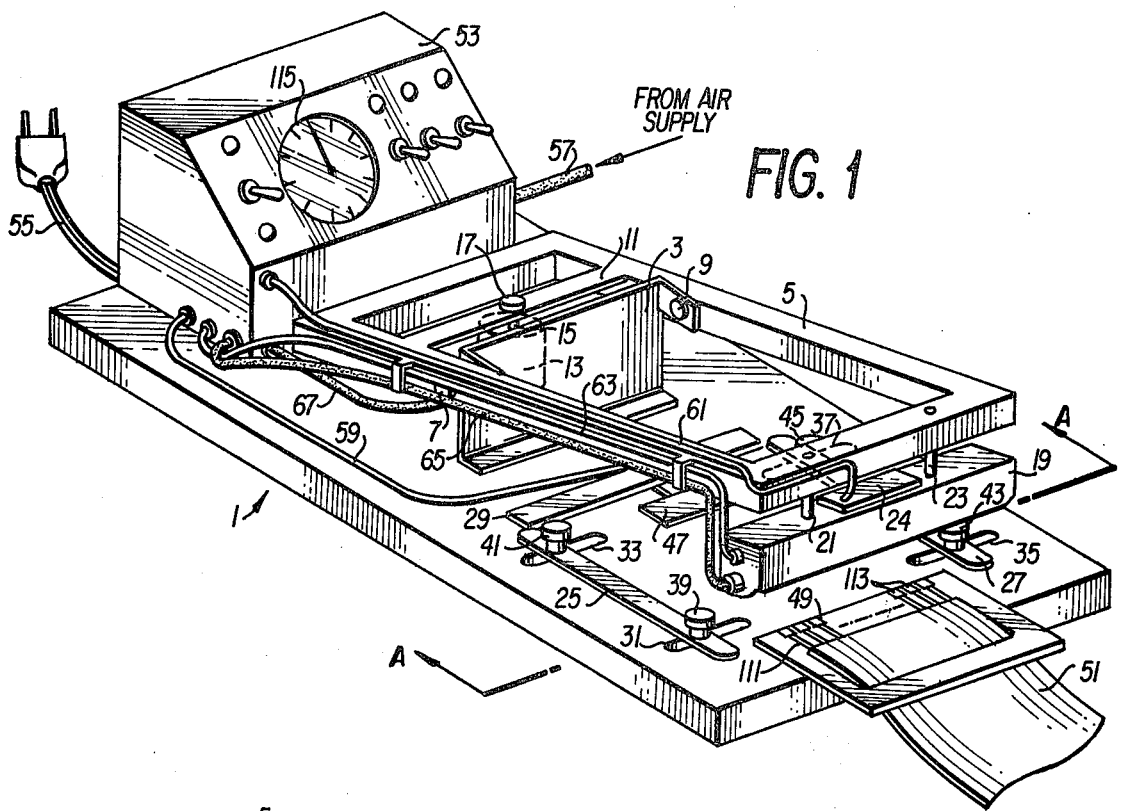
FIG. 1 is a perspective view showing the relationship of the various elements which comprise the present invention.

Referring now to FIG. 1, there is shown a perspective view of a flat-cable soldering apparatus comprising base member 1 having a bracket or support means 3 mounted centrally therein. A vertically pivotable rectangular frame member 5 is attached to bracket 3 by means of pivot means or pins 7 and 9. One end of frame 5 has an attachment strip 11 mounted thereon. A frame driving means 13, preferably an air powered cylinder or piston, is mounted on base 1 directly below strap 11. Driving means 13 has one end of rod 15 attached to coupling or fitting 17 mounted on strap 11.

A heating means shown generally at 19, is attached to the end of frame 5 opposite to driving means 13. Heating means 19 is attached to the underside of frame 5 by means of a pair of threaded rods or bolts 21 and 23. A temperature sensing probe or thermostat 24 is mounted atop heating means 19. Disposed directly below frame 5 and heating means 19 is circuit card or connector receiving means denoted at 25, 27, and 29. The receiving means comprises left and right side adjustable guides 25 and 27 and a rear backstop 29. Guides 25 and 27 are adjustable along slotted grooves 31, 33 and 35, 37 which receive captive nuts and bolts 39, 41 and 43, 45 respectively. Bolts 39, 41 and 43, 45 each have a knurled head which allows an operator to readily loosen and tighten the bolts, as is well-known in the art.

A PC card or connector alignment and interlock sensing means 47 is mounted flush with the top surface of base 1 near rear backstop 29 and between right and left guides 25 and 27. Alignment and sensing means 47, which may be a mechanical, optical or electrical sensor, is used to sense when a circuit card or connector 49 and cable 51 are correctly positioned against backstop 29 and between guides 25 and 27.

Also shown in FIG. 1 is control and timing means 53, discussed in more detail below with respect to FIG. 3. Control and timing means 53 preferably is mounted on base 1 to make for a completely portable soldering unit. Control and timing means 53 is connected to a conventional electrical power source via line cord 55 and to a source of compressed air or other cooling gas through hose 57. Control and timing means 53 is connected to alignment and sensing means 47 through conductor or cable 59. Similarly, control and timing means 53 is connected to thermostat 24 via wires 61 and to heating means 19 through cable 63. A vented source of compressed air or gas is supplied to heating means 19 from timing and control means 53 through hose 65. Similarly, in the preferred embodiment wherein the frame driving means 13 comprises an air actuated piston, piston 13 is connected to timing and control means 53 through hose 67.

Figure 2:
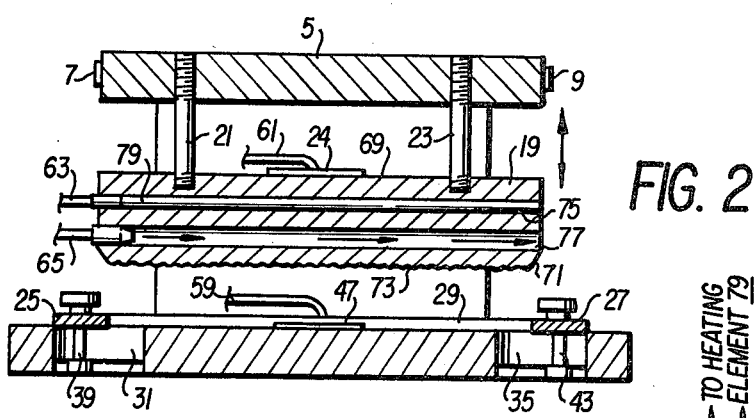
FIG. 2 is a right hand cross sectional view of FIG. 1 taken along line A—A showing the internal construction of the heater bar.

Turning to FIG. 2, there is shown a right side sectional view of the heating means 19 and base 1. Heating means 19 comprises a generally rectangular, elongated member formed from heat conductive metallic bar stock, such as aluminum. Heating means 19 has a generally flat top surface 69 to which thermostat 24 is attached. Lower surface 71 of heating means 19 may be smoothly rounded, as shown in FIG. 1, or have a series of short transverse grooves 73 formed thereon. Heating means 19 includes two longitudinal channels 75 and 77 formed therein. Channel 75 is adapted to receive a resistance heating element 79, of a type well-known in the art. Heating element 79 is of a generally rod-like configuration having an insulative covering formed thereover. Heating means 19 also includes a cooling means comprising channel 77, open at each end thereof, which is adapted to receive at one end a source of compressed air, gas, or other heat conductive fluid supplied through hose 65.

Electric current is supplied to heating element 79 through cable 63 from timing and control means 53. The temperature rise of element 79 will be conducted through heat conductive heater bar 19 to lower surface 71. When it is desired to rapidly or controllably cool heater bar 19 compressed air or gas is vented through hose 65 from timing and control means 53 into cooling channel 77. Since channel 77 is open at the opposite end, the air or gas passes rapidly through channel 77 carrying away heat absorbed from the surrounding heater bar 19.

Figure 3:
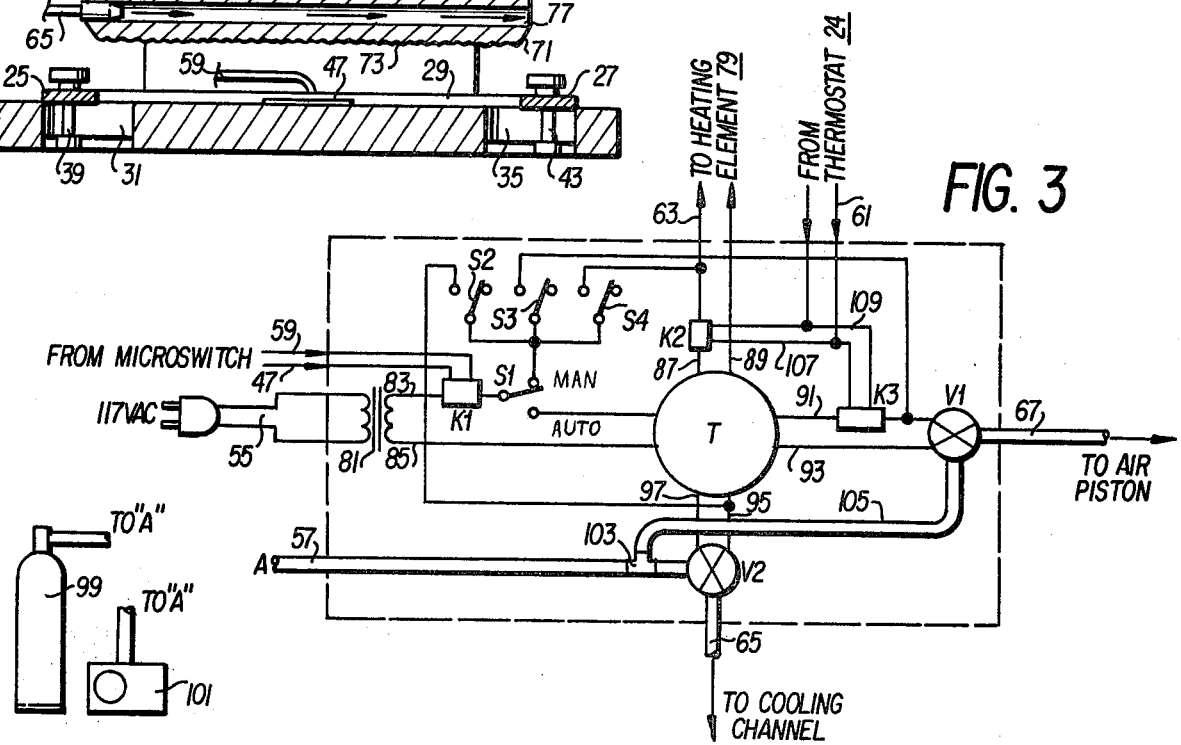
FIG. 3 is a schematic diagram showing the timing and control means of the present invention.

Referring to FIG. 3, there is shown a schematic diagram of one form of control and timing means 53. It is understood that the circuit shown in FIG. 3 is illustrative only and that the control and timing means 53 may take many forms, with different combinations of operative elements, depending on the degree of sophistication and control desired for the soldering apparatus.

Electrical power, such as 117VAC, is supplied to a line transformer 81 through power cord 55. Transformer 81 supplies an output at an appropriate voltage (depending on the components to be used) along lines 83 and 85. Power line 83 has an interlock relay K1 disposed therein which is normally open. Relay K1 is responsive to a signal from card or connector alignment sensor 47 via wires 59. Sensor 47 preferably is a microswitch mounted on base 1, as described above with respect to FIG. 1. Upon proper alignment of a circuit card or connector 49 against backstop 29 and between guides 25 and 27 (as shown in FIG. 1) microswitch 47 will be depressed actuating relay K1 and supplying power along the remainder of line 83. Line 83 is connected to switch S1 which allows an operator to select an automatically timed controlled heat, pressure, cycle and cooling in the AUTO position, or a manually controlled cycle in the MAN position. Line 83 is connected to a multiposition, programmable timer T, of a type well-known in the art. The other power line 85 is also connected to the timer T.

Timer T acts to selectively and controllably supply electrical power along three pairs of output lines 87 and 89, 91 and 93, 95 and 97. Lines 87 and 89 supply current to heating element 79 along cable 63, lines 91 and 93 supply current to a first electrically operated air valve V1, and lines 95 and 97 supply current to a second electrically operated air valve V2. Air hose 57 is connected at one end to valve V2 and at the other end to either a tank of compressed gas or fluid 99 or to a compressor 101. Hose 57 is also coupled to valve V1 through T-connector 103 and hose 105. The output of valve V1 is supplied to hose 67 and thence to frame driving means 13. The output of valve V2 is supplied to cooling channel 77 of heater bar 19 through hose 65.

As can be seen, line 87 of the heating element circuit has an electrically activated relay K2 disposed therein. The opening and closing of relay K2, and hence power transfer from timer T to heating element 79, is controlled by detection of a preset temperature by thermostat 24 mounted on heater bar 19. Similarly, the opening and closing of relay K3, and hence power transfer from timer T to actuate valve V1, is controlled by the detection of a preset temperature by thermostat 24 whose output is applied along cable 61 to relay control lines 107 and 109.

If it is desired to operate the soldering apparatus manually, switch S1 is set in the MAN position, thus connecting input power line 83 to parallel switches S2, S3, and S4, which respectively control application of electrical current to valve V2, valve V1, and to heating element 79. It will be recognized to those skilled in the art that the above-described control and timing elements may take many forms and arrangements depending on the complexity of the control scheme desired.

In preparation for the operation of the soldering apparatus, an operator would plug cord 55 into a suitable source of electrical power and connect gas hose 57 to an appropriate source of compressed air or gas.

A circuit card or connector 49 and flat cable 51 would be assembled together with stripped and pretinned conductors 111 of cable disposed adjacent terminal pads 113 of connector 49. Left and right guides 25 and 27 are then adjusted by means of bolts 39, 41 and 43, 45 along slots 31, 33 and 35, 37 to match the width of connector card 49 and cable assembly 51.

These adjustments having been completed, electrical power is applied by means of a suitable power control switch not shown. Current is immediately supplied through relay K1 to heating element 77 disposed within heater bar 19. Heater bar 19 will then rise in temperature taking from 30 seconds to over a minute to rise to a pre-set temperature generally set for several degrees above the eutectic point for the pre-tinned conductors of cable 51. The temperature rise of heater bar 19 depends on several factors: the ambient air temperature, the heat conductivity and mass of heater bar 19, and whether the heater bar is warmed from a "cold" start or from a previously heated condition. Assuming that the heater bar end of frame 5 is in the fully up position and that control and timing means 53 is in the Automatic mode, the connector card 49 is then positioned and aligned against backstop 29 such that interlock microswitch 47 is depressed.

Interlock microswitch 47 having been actuated permits control of timer T starting circuit supplying a control signal to relay K3 which in turn actuates air valve V1. Valve V1 vents compressed air along hose 67 to air piston 13, causing the air piston to rise along with attached rod 15. Rod 15, connected to strap 11, and thence to pivotable frame 5, rises and causes frame 5 to pivot about pins 7 and 9 supported by bracket 3. The heater bar carrying end of frame 5 is thus controllably lowered toward the circuit card - flat cable assembly disposed directly below the heater bar. It will be noted that thermostat 24 also acts to control relay K2 to cycle the application of current to heater element 79 in order to maintain a precise and controlled temperature for heater bar 19.

The lower surface 71 of heater bar 19 will thus be pressed firmly against the plurality of circuit card conductor-to-flat cable conductor joints causing the pretinned solder coating on cable conductors 111 to reach the eutectic point. At this point rod 15 of air piston 13 is fully vertically extended. Pressure applied to air piston 13 and hence to heater bar 19 and the conductor joints is controlled by an air pressure relief valve (not shown) which is a general feature of most commercial air piston actuators.

Timer T maintains valve V1 connected to air piston 13 in an actuated (open) position for a preset amount of soldering time sufficient to raise terminals 113, wire conductors 111, and the pretinned solder coating thereon to above the eutectic point of the solder coating, to allow for a uniform electrical and mechanical bond to be formed therebetween.

After the preset soldering time has elapsed, timer T, while still keeping valve V1 actuated to cause the heater bar to press firmly along the soldered joints, activates or opens valve V2 causing the supply of air or gas to be vented along hose 67 into cooling channel 77 of heater bar 19. Timer T also disconnects current from heating element 79 at this time. Air or gas passing through channel 77 absorbs the heat of heater bar 19 and expels it through the open end of channel 77, as shown in FIG. 2. Such an arrangement has the advantage over prior art "heat sink" type cooling means in that the provision of an air or gas cooled channel disposed within the heater bar allows a much more rapid and controlled "cool-down" cycle. It will be noted that since the heater bar 19 remains in contact with the soldered joints 111, 113 of the cable 51 and circuit card 49, these joints will also be rapidly and controllably cooled well-below their eutectic point. Thus, the forced air cooling means of the present invention will allow faster cycling or "throughput" soldering than prior art apparatus. It is important to note that in addition to the above benefits, since the cooled heater bar remains in contact with the soldered joints while they are cooling, the joints are more likely to be mechanically and electrically uniform since the pressure of the bar 19 along the soldered joints will prevent mechanical flexure or degradation of the joints and will simultaneously cool all such joints at the same rate.

After cooling channel 77 of heater bar 19 has been supplied cooling air for a sufficient time to cool the heater bar 19 and soldered joints of the card connector-cable assembly well below the solder eutectic point, timer T will cycle off causing the air piston and cooling channel air valves V1 and V2, respectively, to be shut off. Rod 15 of air piston 13 will sink causing the heater bar end of frame 5 to be raised to its maximum upward extension. The soldered circuit card and cable assembly may then be removed from between the guides 25 and 27. Restoration of current to heater bar 19 is also effected when times T cycles off, thus initiating the heat recovery cycle, averaging 20-30 seconds to reach the present soldering temperature. The soldering apparatus is now ready for the next circuit card and cable units to be soldered.

As is shown in FIG. 3, the above described heating, pressure, and cooling cycles can be manually activated by switches S4, S3, and S2 which act to bypass the control of timer T. In the manual mode, switch S1 is switched to the MANUAL position to supply power from power line 83 to the three manually controlled switches S2, S3, and S4. It will be noted that timer T may include a clock face or dial 115 as is shown generally in FIG. 1. Manual control of the separate functions provides the capability of predetermining optimal parameters for the programmed heating, pressure, and cooling cycles.

It will be noted that the lower surface 71 of heater bar 19 may be smoothly rounded (as shown in FIG. 1) or have a plurality of uniformly spaced ridges or grooves 73 formed thereon (as shown in FIG. 2). While either type of heater bar bearing surface can be used, the ridged surface 73 shown in FIG. 2 is of special utility when soldering a large number of closely spaced circuit card contacts and flat cable conductors together. The ridged and grooved surface 73 of heater bar 19 would act to isolate adjacent conductors 111 of a flat cable 51 (as shown in FIG. 1) and prevent the accidental soldering of two such conductors together.

It will also be noted that although the frame driving means 13 has been described as being an air-activated piston 13, other devices, such as an incremental electrical solenoid or stepper motor could be advantageously employed as is well-known in the art. If such an electrically actuated driving means was substituted for the disclosed air piston, obviously the timer actuated valve V1 (shown in FIG. 3) would be replaced by an appropriate relay actuator device.

Thus it can be seen that the present invention provides for a simple, economical, and readily transportable multi-wire flat cable soldering apparatus having controlled heating, pressure, and cooling cycles and possessing many other advantages over such prior art devices. While the soldering apparatus of the present invention has been described in considerable detail, it is understood that various changes and modifications may occur to persons of ordinary skill in the art without departing from the spirit and scope of the invention as is defined in the appended claims.

What is claimed is:

1. Soldering apparatus for pretinned multiwire flat cable and circuit card connectors, comprising:
    a base member;
    a support bracket mounted on said base member;
    a frame member vertically, pivotally mounted to said bracket;
    a frame driving means mounted on said base member and movingly coupled to one end of said frame member;
    means for receiving and aligning said circuit card connector and said pretinned multiwire flat cable to provide a plurality of circuit card conductor-to-flat cable conductor joints, said means for receiving and aligning being adjustable and mounted on said base member below said heating means;
    means for heating circuit card conductor-to-flat cable conductor joints above the eutectic point of said pretinned multiwire flat cable, said heating means mounted on said frame member on an end opposite of said frame driving means, said heating means including a heating element and an elongated bar of heat conducting material; and
    timing and control means for controllably actuating said heating means and said frame driving means to cause said heating means to be heated above the eutectic point of said pretinned multiwire flat cable and to cause said frame driving means to pivot said frame such that said elongated bar of heat conducting material contacts said pretinned multiwire flat cable and circuit card connector to solder them together at a preset pressure.

2. The soldering apparatus of claim 1 wherein said heating means comprises an elongated bar of heat conductive material having first and second longitudinal channels formed therein, said first channel receiving an electrical resistance heating unit and said second channel being connected to a vented source of cooling gas, said heating unit and said vented source of cooling gas controllably actuated by said timing and control means.

3. The soldering apparatus of claim 2 wherein said heater bar has a plurality of grooves formed on the lower surface thereof.

4. The soldering apparatus of claim 1 wherein said frame driving means comprises an air-actuated piston, said piston being drivingly connected to said frame member by an actuator rod.

5. The soldering apparatus of claim 1 wherein said heating means includes a temperature sensor mounted atop said heating means and connected to said timing and control means.

6. The soldering apparatus of claim 1 wherein said base member includes safety interlock means disposed between said circuit card connector and flat cable receiving means and connected to said timing and control means for electrically disabling said timing and control means if said circuit card connector or flat cable are improperly positioned or aligned within said receiving means.

7. Apparatus for soldering electrical connections to be made between pretinned multiwire flat cable conductors and circuit card connectors and having controlled heating, pressure and cooling cycles, comprising:
    a base member;
    a support bracket mounted on said base member;
    a frame member vertically, pivotably mounted to said bracket;
    a frame driving means mounted on said base member and movingly coupled to one end of said frame member;
    heating means mounted on said frame member on an end opposite said frame driving means, said heating means comprising an elongated bar of heat conductive material, said heating bar having a rounded lower contacting portion and including first and second longitudinal channels formed therein, said first channel receiving an electrical resistance heating unit and said second channel being connected to a vented source of cooling gas;
    adjustable circuit card connector and flat cable receiving means mounted on said base member below said heating means; and
    timing and control means for controllably actuating said resistance heating unit, said frame driving means, and said vented source of cooling gas causing in sequence said heater bar to be heated above the eutectic point of said pretinned multiwire cable, said frame driving means to pivot said frame such that said lower contacting portion of said heater bar contacts said pretinned multiwire flat cable conductors and circuit card connectors to solder their electrical connections together at a preset pressure for a preset amount of time, said vented source of cooling gas to be supplied to said second channel formed in said heater bar to controllably lower said heater bar and said soldered circuit card and pretinned multiwire flat cable connections below their eutectic point, and said frame driving means to pivot said frame such that said heater bar no longer contacts said soldered circuit card connectors and pretinned multiwire flat cable conductors.

8. The soldering apparatus of claim 7 wherein said heater bar has a plurality of grooves formed on the lower surface thereof.

9. The soldering apparatus of claim 7 wherein said frame driving means comprises an air-actuated piston, said piston being drivingly connected to said frame member by an actuator rod.

10. The soldering apparatus of claim 7 wherein said heating means includes a temperature sensor mounted atop said heating means and connected to said timing and control means.

* * * * *